(12) United States Patent
Okada

(10) Patent No.: US 8,664,943 B2
(45) Date of Patent: Mar. 4, 2014

(54) POSITION DETECTING APPARATUS

(75) Inventor: Ichiro Okada, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 286 days.

(21) Appl. No.: 12/831,625

(22) Filed: Jul. 7, 2010

(65) Prior Publication Data

US 2012/0007589 A1 Jan. 12, 2012

(51) Int. Cl.
*G01B 7/14* (2006.01)

(52) U.S. Cl.
USPC .............. 324/207.2; 324/207.11; 324/207.13; 324/207.23; 324/207.24; 324/207.25; 702/145; 702/151; 702/163; 73/862.331; 73/862.326; 73/117.02

(58) Field of Classification Search
USPC ............. 324/207.1, 207.2, 207.25; 338/32 R, 338/32 H; 123/612
See application file for complete search history.

(56) References Cited

U.S. PATENT DOCUMENTS

| | | | |
|---|---|---|---|
| 4,424,875 A * | 1/1984 | Yoshida | 180/168 |
| 5,241,267 A * | 8/1993 | Gleixner et al. | 324/207.2 |
| 6,940,799 B1 * | 9/2005 | Ma et al. | 369/53.25 |
| 2005/0030018 A1* | 2/2005 | Shibahara et al. | 324/251 |
| 2005/0179429 A1* | 8/2005 | Lohberg | 324/207.13 |
| 2005/0258820 A1* | 11/2005 | Forster | 324/165 |
| 2005/0258822 A1* | 11/2005 | Hara et al. | 324/207.2 |
| 2006/0066296 A1* | 3/2006 | Kuroyanagi et al. | 324/207.2 |
| 2009/0309590 A1* | 12/2009 | Kataoka et al. | 324/244 |
| 2011/0101975 A1* | 5/2011 | Popovic et al. | 324/251 |

FOREIGN PATENT DOCUMENTS

| | | | |
|---|---|---|---|
| JP | 04-305158 A | 10/1992 | |
| JP | 2003-065796 A | 3/2003 | |
| JP | 2003-075195 A | 3/2003 | |
| JP | 2003-142752 A | 5/2003 | |

OTHER PUBLICATIONS

Asahi Hybrid Hall Effecgt IC EW-series catalogue by Asahi Kasei Electronics Co., Ltd., Jul. 1, 1999, 96303HE, p. 3, p. 6.
Official Notice of Rejection mailed May 11, 2012 in corresponding Japanese Patent Application No. 2007-328045.

* cited by examiner

*Primary Examiner* — Arleen M Vazquez
*Assistant Examiner* — Thang Le
(74) *Attorney, Agent, or Firm* — Morgan, Lewis & Bockius LLP

(57) ABSTRACT

The present invention provides a single component implementing highly precise pulse detection for rotational or liner position detecting apparatuses for jog dials and mechanical products. Focusing on the fact that the phase difference between the magnetic fields in circumferential and radial directions generated by a magnetized ring is precisely 90 degrees, a position detecting apparatus of the present invention includes two Hall elements placed at a distance; a protective film provided on magnetic sensitive portions of the two Hall elements to cover the magnetic sensitive portions; a thin-film magnetic plate placed on the protective film to cover the magnetic sensitive portions of the two Hall elements; and further a processing circuit calculating the sum and difference of the signals from the two Hall elements to generate signals having an accurate phase difference of 90 degrees. The position detecting apparatus can therefore detect the rotation direction and precise rotation angle.

6 Claims, 12 Drawing Sheets

POSITION DETECTING APPARATUS

BACKGROUND OF THE INVENTION

1. Field of the Invention

The present invention relates to a rotational or linear position detecting apparatus for mechanical products such as industrial machines and automobiles, jog dials of hand-held computing devices, and the like.

2. Description of the Related Art

Known rotary or linear pulse encoders each include a magnetic sensor and a ring or a linear scale facing the ring or linear scale and being magnetized so that the opposite magnetic poles can be alternately arranged at a regular pitch. The magnetic sensor translates the magnetic flux density in a direction passing through the magnetic sensor into Hall output voltage, the magnetic flux density changing along with relative rotation of the ring and the magnetic sensor or relative movement of the scale and the magnetic sensor. The translated analog signal is outputted as pulses through a Schmitt circuit or the like (for example, see ASAHI Hybrid Hall Effect IC EW-series catalogue by Asahi Kasei Electronics Co., Ltd. Jul. 1, 1999, 96303HE, P3, P6). Since the aforementioned linear scale is considered as a part of an alternately magnetized ring with infinite radius, the following description is given using a rotary pulse encoder as an example.

FIG. 3 is a view showing an example of a conventional rotary pulse encoder. Reference numeral 11 denotes a ring magnetized so that the opposite magnetic poles can be alternately arranged at a regular pitch. Reference numerals 12 and 13 denote Hall ICs as magnetic sensors placed near the ring. Herein, it is only necessary to count the number of pulses for detecting rotation angle or speed. In this case, only one sensor is used. FIG. 4 is a block diagram of each Hall IC used in such a case. The Hall IC includes a Hall element 21, am amplifier 22, a Schmitt circuit 23, and a driver, which are integrated. Such a Hall IC is widely used.

FIG. 3 shows the Hall elements 12 and 13 at a certain time when the Hall element 12 is located at the center of a south magnetic pole of and the Hall element 13 is located at the boundary between opposite magnetic poles. The shown arrangement of the Hall ICs relative to the magnetized ring illustrates a configuration to detect the rotation direction. This case is further described using FIG. 6. FIG. 6 is a view for clear explaining the relationship between the positions of the sensors relative to the magnetized ring, and the relationship between the positions and the magnetic flux density received by the sensors. In FIG. 6, the magnetized ring is drawn linearly. As shown in FIG. 6, at least two sensors (sensors A and B indicated by reference numerals 12 and 13, respectively) are placed at a distance equal to a half of the pole pitch of the magnetized ring. The rotation direction can be detected by observing an output of one of the sensors at a rising or falling edge of the output of the other sensor.

FIG. 7 is a view showing that the density flux densities detected by the Hall elements of the sensors A and B in FIG. 6 change with relative movement of the sensors A and B as the sensors A and B move or rotate relative to the magnetized ring at constant speed or constant angular speed. Herein, the point of t=0 indicates the positional relationship between the pole pitch of the magnetized ring and the sensors shown in FIG. 6. For example, as the sensor A is located at the center of a north magnetic pole when t=0, the magnetic flux density decreases in whichever direction the sensor A rotates. On the other hand, as the sensor B is located at the boundary between north and south magnetic poles when t=0, the sensor B moves toward the north or south magnetic pole depending on the moving direction. If the sensor B moves toward the north magnetic pole, the magnetic flux received by the sensor B changes to the same magnetic flux as the sensor A receives when t=0. If the sensor B moves toward the south magnetic pole, the magnetic flux received by the sensor B changes in an opposite way.

In FIG. 7, the output of the sensor B at each falling edge of the output of the sensor A is high during forward movement and is low during reverse movement.

The distance between the two sensors is preferably set so that the phase difference between the output signals of the two sensors is equal to an electrical angle of $\pi/2$. In this case, the positions of the sensors A and B depend on the pole pitch of the magnetized ring. When the phase difference is $\pi/2$, the rate of pulses is doubled by XORing the outputs of the two sensors, compared to the case of using one sensor. Accordingly, the detection resolution can be made twice as high as that obtained by only using the output of one sensor even with a same magnetized ring. In this case, it is ideally required that the sections with the opposite magnetic poles in the magnetized ring have same magnetic strength and a same dimension in the rotation direction and that the changes in magnetic flux received by the two sensors be equal to each other except for the phase. In such a case, the output of the aforementioned XOR operation has a duty ratio of 1:1, which has a constant period.

However, if the two sensors are separately arranged at a distance depending on the pole pitch of the magnetized ring so as to face the magnetized ring, the two sensors may be misaligned. Such mounting misalignment has a relatively great influence especially when the magnetized ring has a narrow pole pitch, in particular. In this case, it is difficult to enhance the detection accuracy. Specifically, when the pole pitch is narrow, the mechanical angle corresponding to the electrical angle of $\pi/2$ is small. Accordingly, the dispersions in mechanical positions of the two sensors more significantly affects the phase difference in electrical angle, or the optimal distance between the two sensors varies depending on the distances between the sensors and the magnetized ring.

To solve the aforementioned problems, a single package may be formed in such a way that the two sensors are formed on a same substrate at a distance and sealed in the single package, or that two sensors having same characteristics are formed on a same lead frame at a distance and sealed in the single package. However, magnetized rings to be sensed have a wide variety of sizes and pole pitches. For precise detection of magnetized rings having different pole pitches, it is necessary to change the distance between the two sensors depending on the magnetic rings to be sensed or according to the distances between the sensors and the magnetized ring.

SUMMARY OF THE INVENTION

The present invention was made in the light of the aforementioned problems, and an object of the present invention is to provide a position detecting apparatus capable of solving the problem that a phase difference between two elements occurs due to dispersion in sensitivity or mounting misalignment of the two elements and the problem that the distance between the sensors needs to be changed each time the pole pitch of a rotor changes. In short, an object of the present invention is to provide a position detecting apparatus not depending on the pole pitch of the rotor or the distance between the two elements and the rotor.

In order to achieve the aforementioned object, according to the present invention, a position detecting apparatus includes: a ring-shaped or linear magnetic flux source in which opposite magnetic poles are alternately arranged at an equal pitch; and a Hall IC used in combination with the magnetic flux source, in which the Hall IC includes: two Hall elements placed at a distance from each other; a protective film placed on a magnetic sensitive portion of the respective two Hall elements and configured to cover the magnetic sensitive portions; and a thin-film magnetic plate placed on the protective film to cover the magnetic sensitive portions of the two Hall elements.

Portions of the thin-film magnetic plate covering the magnetic sensitive portions are end portions of the thin-film magnetic plate having a belt shape, the end portions being opposite to each other.

Portions of the thin-film magnetic plate covering the magnetic sensitive portions are separated from each other at a midpoint of the two Hall elements in a direction orthogonal to a straight line connecting the two Hall elements.

The position detecting apparatus further includes: a first circuit generating a sum signal of outputs of the two Hall elements; a first Schmitt circuit comparing an output signal of the first circuit and a Schmitt level to output a comparison result; a second circuit generating a differential signal of the outputs from the two Hall elements; a second Schmitt circuit comparing an output signal of the second circuit and a Schmitt level to output a comparison result; a direction output circuit receiving the comparison results from the first and second Schmitt circuits and generating an output concerning a direction; and a pulse output circuit receiving the comparison results from the first and second Schmitt circuits and generating an output by XORing the received outputs.

The two Hall elements, the first and second circuits, the first and second Schmitt circuits, the direction output circuit, and the pulse output circuit are formed on a substrate.

The two Hall elements, the first and second circuits, the first and second Schmitt circuits, the direction output circuit, and the pulse output circuit are accommodated in a case.

When being used in a combination with a magnetized ring, the position detecting apparatus of the present invention is capable of precisely detecting two signals, which are dependent on the rotation direction, with a phase difference of $\pi/2$ independently of the pole pitch of the magnetized ring or the distance to the magnetized ring. Moreover, the position detecting apparatus includes the magnetic plate near the two Hall elements and utilizes the sum and difference of the outputs of the two Hall elements, and thereby can obtain an effect as twice high as the sensitivity of the Hall elements. Accordingly, the position detecting apparatus can be reduced in size as compared with conventional apparatuses and is capable of detecting rotational position with high accuracy without any restriction on the mounting distance between the sensors (positions of the sensors).

Further features of the present invention will become apparent from the following description of exemplary embodiments (with reference to the attached drawings).

DESCRIPTION OF THE EMBODIMENTS

First Embodiment

Figure 1A:
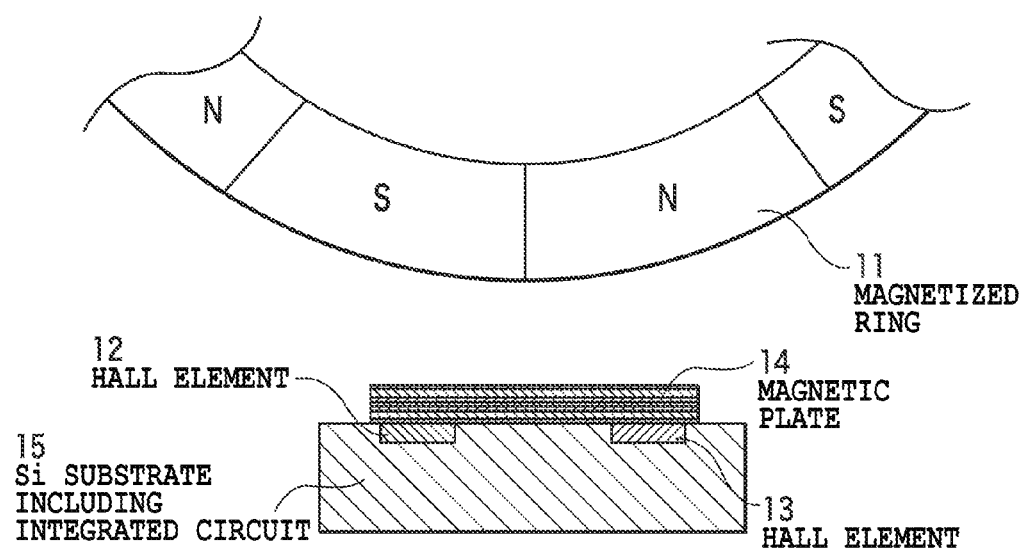
FIG. 1A is a view for explaining a relationship between a magnetized ring and a Hall IC according to a first embodiment of the present invention.
Figure 1B:
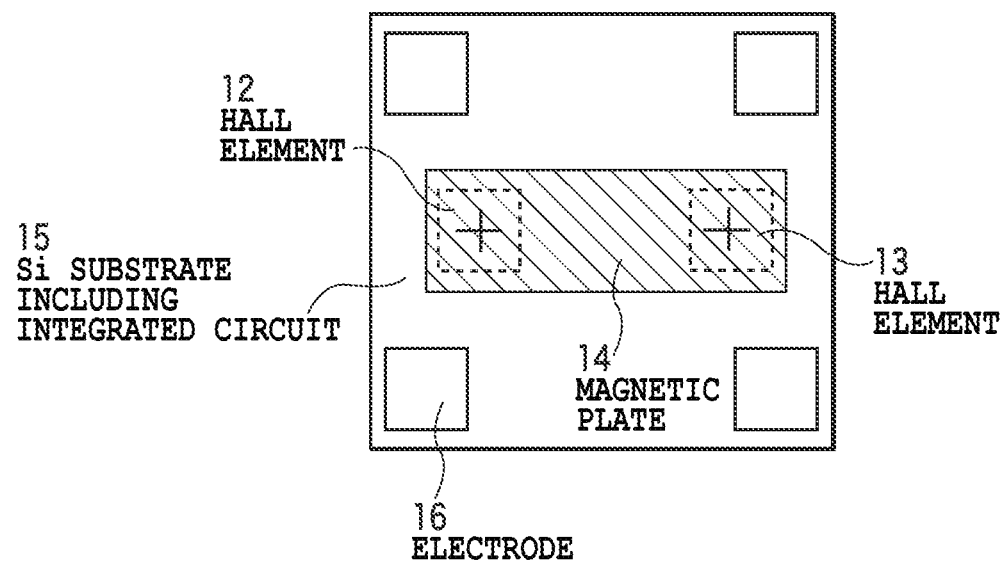
FIG. 1B is a plan view of the Hall IC of FIG. 1A.

FIG. 1A is a view for explaining a relationship between a magnetized ring and a Hall IC according to the first embodiment of the present invention. FIG. 1B is a plan view showing the Hall IC of FIG. 1A. FIGS. 1A and 1B are not enlarged views and are not intended to show the dimensional relationship between the magnetic ring and Hall IC. In the Hall IC, two Hall elements are formed on a Si substrate away from each other, and a protective film is provided thereon. Furthermore, a rectangular thin-film magnetic plate 14 made of a Ni—Fe alloy is formed thereon by plating so as to overlap the two Hall elements at both ends. The plane shown in FIG. 1B is a plane positioned in parallel to the circumferential surface of the magnetized ring. The Hall elements 12 and 13 are configured to detect the magnetic flux density in a direction vertical to the plane shown in FIG. 1B. The Hall IC is positioned so that the two Hall elements are located on a straight line extending in a rotation direction in FIG. 1A.

Figure 11:
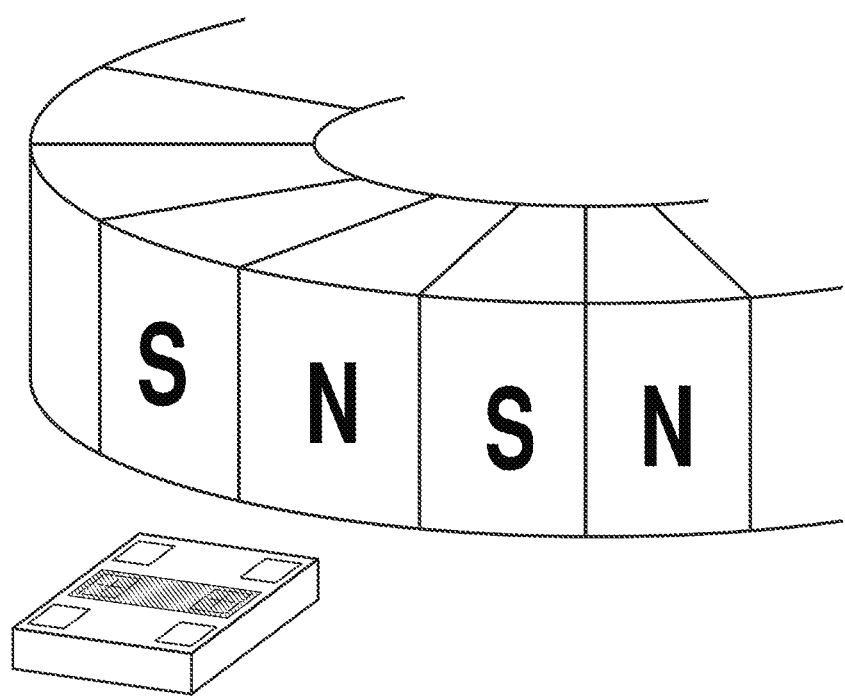
FIG. 11 is another view showing the main portion of the Hall IC according to the first embodiment of the present invention.

As shown in FIG. 11, the plane shown in FIG. 1B may be positioned vertically to the circumferential surface of the magnetized ring. The Hall elements 12 and 13 detect the magnetic flux density vertical to the plane shown in FIG. 1B also in this case. Moreover, the Hall IC is also positioned so that the two Hall elements are located on a straight line extending in the rotation direction as shown in FIG. 1A.

In FIG. 1B, the magnetic plate 14 has a belt shape wide enough to cover a magnetic sensitive portion of each Hall element and is placed so that the magnetic sensitive portions of the Hall elements are located at opposite ends of the belt shape.

Figure 5:
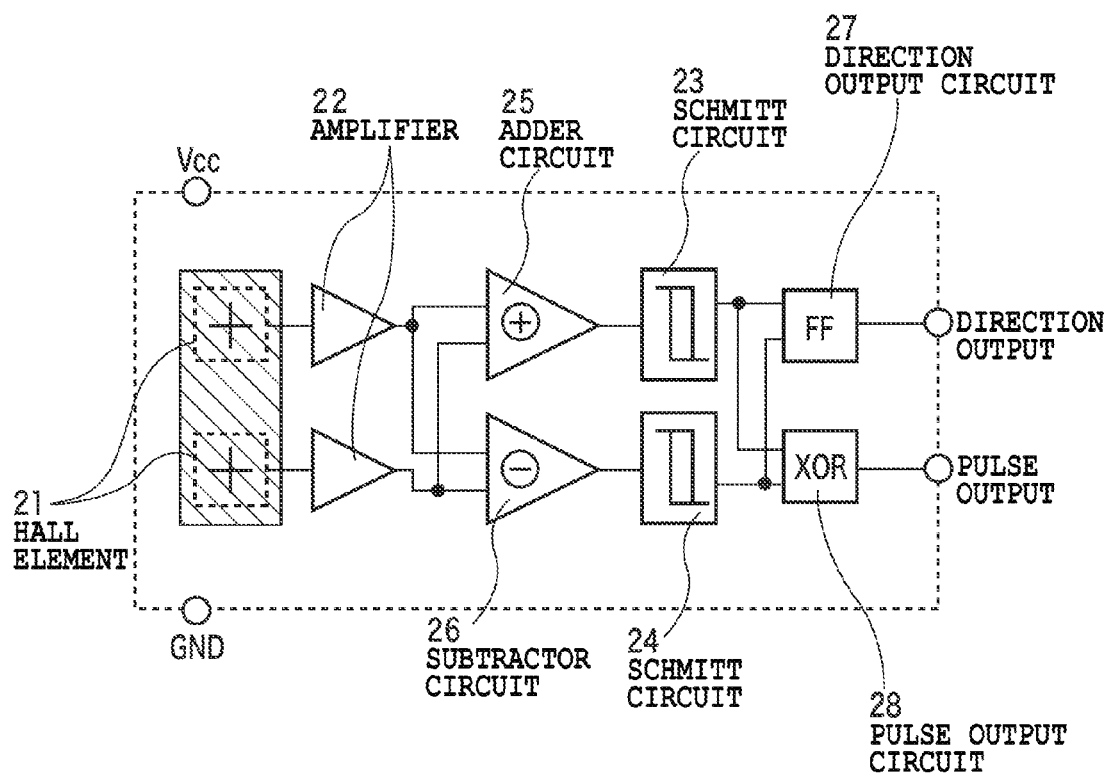
FIG. 5 is a block diagram showing an example of an integrated circuit in the embodiments of the present invention.

FIG. 5 is a block diagram showing circuits formed on the same Si substrate other than the Hall elements. In the block diagram of FIG. 5, reference numeral 21 denotes Hall element; 22, an amplifier; 25, an adder circuit; 26, a subtractor circuit; 23 and 24, Schmitt circuits having Schmitt levels; 27, a direction output circuit; and 28, an XOP, circuit.

Herein, in the Schmitt circuits 23 and 24, unlike a comparator using a single reference level, input levels (Schmitt levels), which change the outputs, change according to the output states. The input/output characteristics thereof have a hysteresis. The Schmitt circuits are used so as to prevent errors from being included in the direction or pulse outputs because of noise contained in the outputs from the adder or subtractor circuits 25 and 26. The outputs from the adder or subtractor circuits 25 and 26 can be passed through a filter before being inputted to the Schmitt circuits 23 and 24.

The output terminals of the Schmitt circuits 23 and 24 are connected to the direction output circuit 27. The direction output circuit 27 observes the output of the Schmitt circuit 24 at rising or falling edges of the output signal from the Schmitt circuit 23 or/and observes the output of the Schmitt circuit 23 at rising or falling edges of the output signal from the Schmitt circuit 24. In the former case, the direction output circuit 27 outputs, for example, a high-level signal when the output of the Schmitt circuit 24 is low level at a rising edge of the output signal of the Schmitt circuit 23 or is high level at a falling edge thereof. Alternatively, the direction output circuit 27 outputs, for example, a low-level signal when the output of the Schmitt circuit 24 is high level at a rising edge of the output signal of the Schmitt circuit 23 or is low level at a falling edge thereof. In the latter case, the direction output circuit 27 outputs, for example, a high-level signal when the output of the Schmitt circuit 23 is high level at a rising edge of the output signal of the Schmitt circuit 24 or is low level at a falling edge thereof. The direction output circuit 27 outputs, for example, a high-level signal when the output of the Schmitt circuit 23 is low level at a rising edge of the output signal of the Schmitt circuit 24 or is high level at a falling edge thereof. The direction output circuit 27 thus outputs the rotation direction. The signals from the Schmitt circuits 23 and 24 are XORed to a pulse output, which is used as a rotation pulse output.

Herein, the position detecting apparatus according to the present invention shown in FIGS. 1A, 1B, and 5 is considered below.

Figure 6:
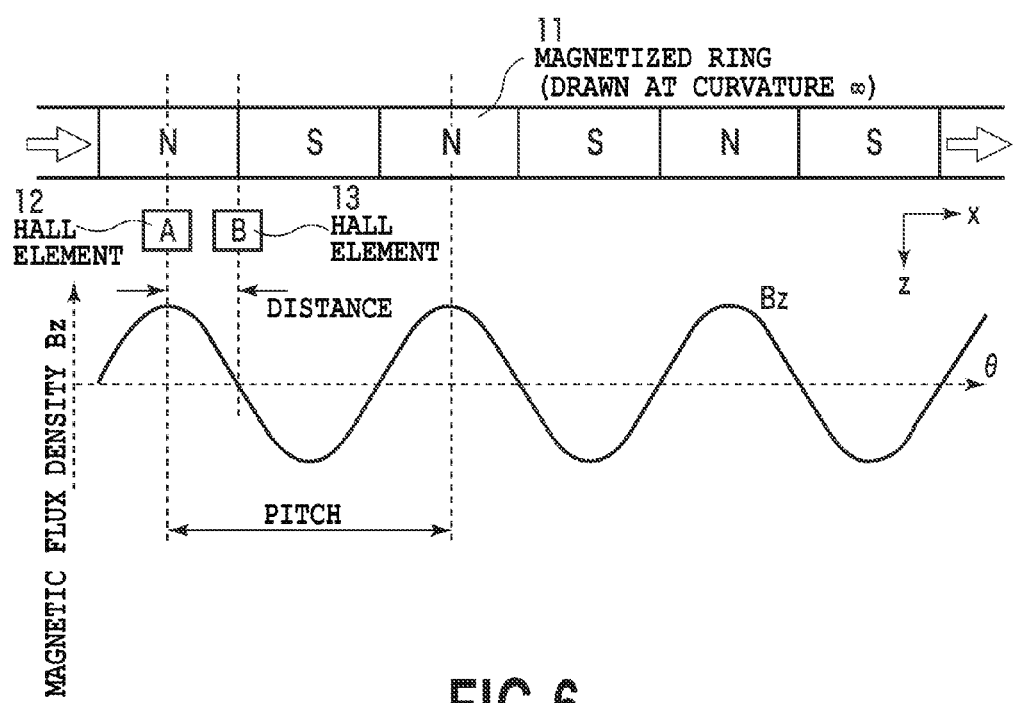
FIG. 6 is an explanatory view showing a magnetized ring, a distribution of magnetic flux density near the surface of the magnetized ring, and an example of the conventional art.

The first attention focuses on the magnetic field distribution around magnetic poles of the magnetized ring. Herein, the rotation direction in parallel to the circumferential surface of the magnetized ring is indicated by a direction X, and the direction vertical to the same is indicated by a direction Z. As shown in FIG. 6, magnetic flux density Bz which is vertical to the plane shown in FIG. 1F (vertical to the circumferential surface of the magnetized ring) and can be detected by the Hall element 13 changes sinusoidally along with the relative movement of the magnetized ring and Hall elements. On the other hand, the magnetic flux density component Bx in the direction X, which is orthogonal to the magnetic flux density component Bz, also changes substantially sinusoidally. Such a change in magnetic flux density Bx is translated to a signal used for normal rotation detection using a ferromagnetic thin-film magnetic resistance element.

Figure 8:
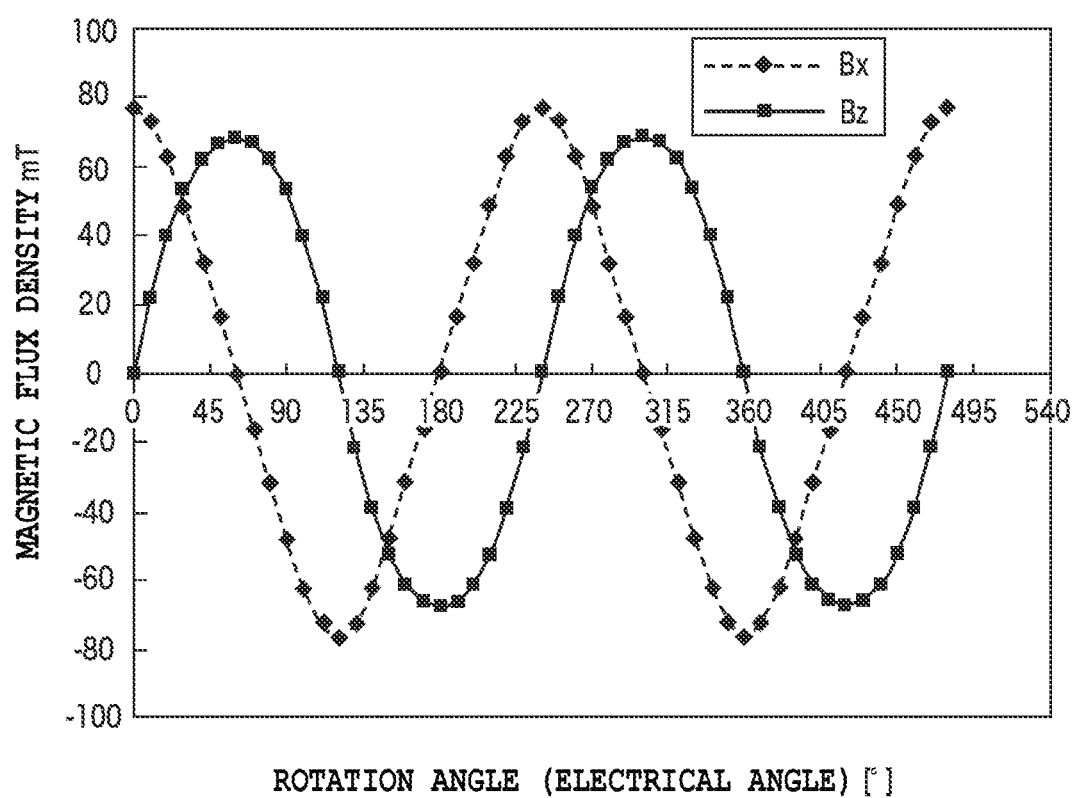
FIG. 8 show simulated values of magnetic flux densities in Z and X directions near the surface of the magnetized ring.

FIG. 8 shows changes in Bx and Bz with respect to the movement of the Hall elements relative to the magnetized ring, which are calculated by magnetic simulation. The drawing reveals that Bx changes with a phase difference of $\pi/2$ away from Bz (although normally the peak value of Bx is different from that of Bz). Herein, the period thereof corresponds to a pole pitch of the magnetized ring. The zero-cross points of Bz and Bx have an accurate phase difference of $\pi/2$. Accordingly, simultaneous detection of the zero-cross points of the Bz and Bx due to the magnetized ring can lead to output of two signals with a phase difference of $\pi/2$ in electrical angle. In fact, the Schmitt circuits having the hysteresis characteristic are used because a zero-cross comparator sometimes causes fluctuations in output due to electric or magnetic noise from the circuits and the surroundings.

The relationship between the phases of Bz and Bx depends on the rotation direction. Accordingly, the rotation direction can be detected by sensing which phase of the two signals leads. The phases can be detected in the waveforms rectified by the Schmitt circuits by observing the level of one waveform at a rising or falling edge of the other waveform. The principle for detecting Bz and Bx is described below.

First, as a method for extracting Bx, consideration is made on combining the two Hall elements placed facing the magnetic poles to sense the magnetic flux and the magnetic plate placed to bridge the magnetic sensitive portions of the two Hall elements.

Figure 10:
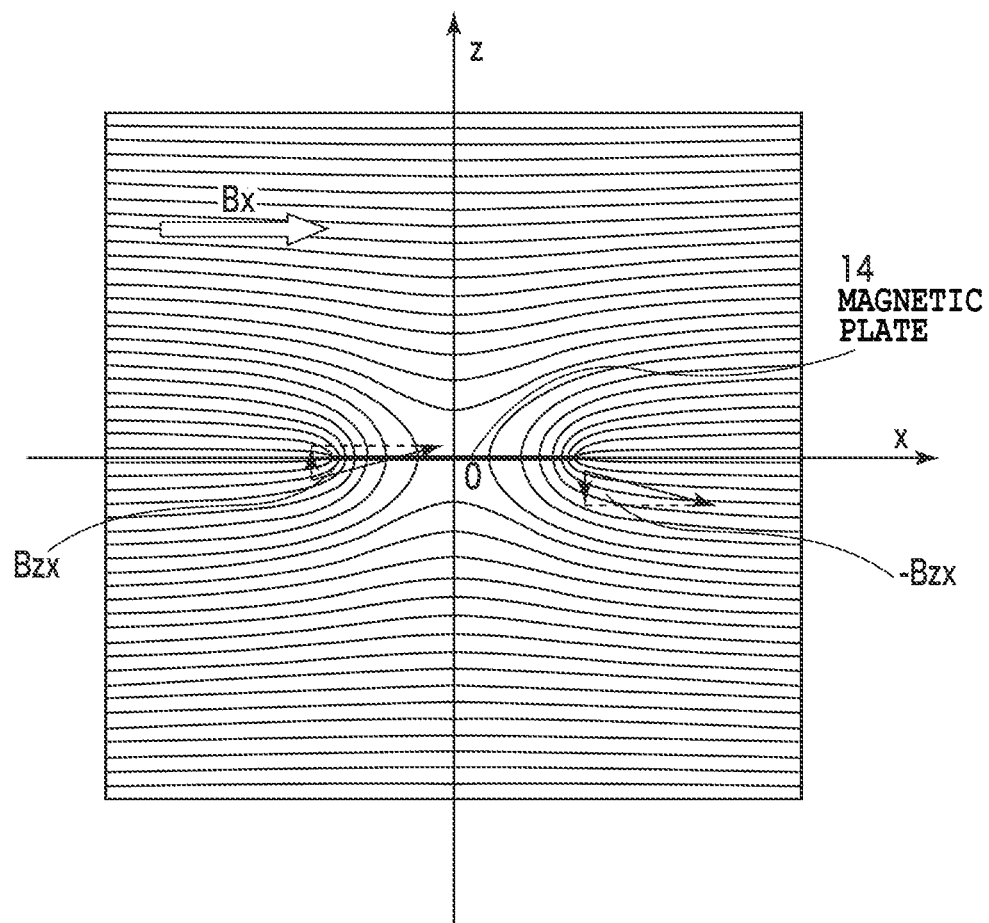
FIG. 10 is a view showing simulation results of magnetic field lines around a magnetic plate placed in a uniform magnetic flux density field parallel to the direction X, showing a plane including X and Z axes.

FIG. 10 shows magnetic field lines induced around the magnetic plate 14 shown in FIG. 1A when the magnetic field in the direction X is applied to the magnetic plate 14. The horizontal and vertical axes indicate the directions X and Z, respectively. At the both ends of the magnetic plate 14, the magnetic field lines enter the magnetic plate 14. This means that the magnetic flux density in the direction Z is generated at the both ends of the magnetic plate 14, in other words, that the magnetic field density Bx in the direction X is converted into magnetic flux density Bzx. The converted magnetic flux density Bzx is proportional to Bx, and the coefficient thereof is a function of the shape of the magnetic body and the position relative to the magnetic body. At the right and left ends of the magnetic plate 14, the distribution of Bzx is symmetrical because of the symmetry of the magnetic field. The magnetic flux density Bzx have equal absolute values with different polarities at positions which are equally distant from the magnetic plate 14 and are symmetrical in the horizontal direction. Accordingly, a signal proportional to the magnetic flux density Bx in the direction X can be extracted by calculating the difference between the output signals from the both Hall elements located near the both ends of the magnetic plate 14. At this time, the two Hall elements must receive Bz of a same magnitude and polarity because of the presence of the magnetic plate 14 or are configured so as to receive Bz of a same magnitude and polarity. Even if the magnetic flux density Bz in the direction Z is superimposed on Bzx, therefore, the influence of Bz can be canceled by calculating the difference between the output signals from the both Hall elements.

On the other hand, by adding up the output voltages of the two Hall elements, a signal proportional to Bz can be obtained while the influence of Bzx is canceled.

In the other words, the signal proportional to Bx shown in FIG. 8 can be obtained by calculating the difference between the outputted signals of the both Hall elements, and the signal proportional to Bz can be obtained by calculating the sum of the output signals of the both Hall elements. The Hall IC according to the present invention can generate signals corresponding to the output signals of the Hall elements A and B shown in FIG. 6, for example, irrespective of the pole pitch of the magnetized ring, or independently of the relationship between the pole pitch of the magnetized ring and the distance between the two Hall elements of the Hall IC of the present invention.

In order to extract Bzx of high level, it is preferable that the magnetic plate 14 has a high aspect ratio and is located at a short distance from each magnetic sensitive portion in the direction Z. It is therefore preferable that the magnetic body 14 has a rectangular or an elongated-elliptic planar shape. Moreover, as for the relationship between the magnetic plate 14 and the magnetic sensitive portions (the Hall elements 12 and 13), preferably, the magnetic plate 14 has a shape overlapping the whole magnetic sensitive portions in order that uniform magnetic flux density is applied to the Hall elements.

Moreover, it is certain that the distance between the two Hall elements is preferably small to observe Bz and Bx at the same position.

As considered above, the two signals obtained by the position detecting apparatus shown in FIGS. 1A, 1B, and 5, for example, the differential signal between the output signals of the two Hall elements and the sum signal of the output signals of the two Hall elements have an precise phase difference of π/2 irrespective of the pole pitch of the magnetized ring or the distance between the magnetic ring and each Hall element. Accordingly, by XORing the two signals, the number of pulses per revolution can be doubled with an accurate duty ratio of 1/1. In other words, the resolution can be doubled.

Figure 7:
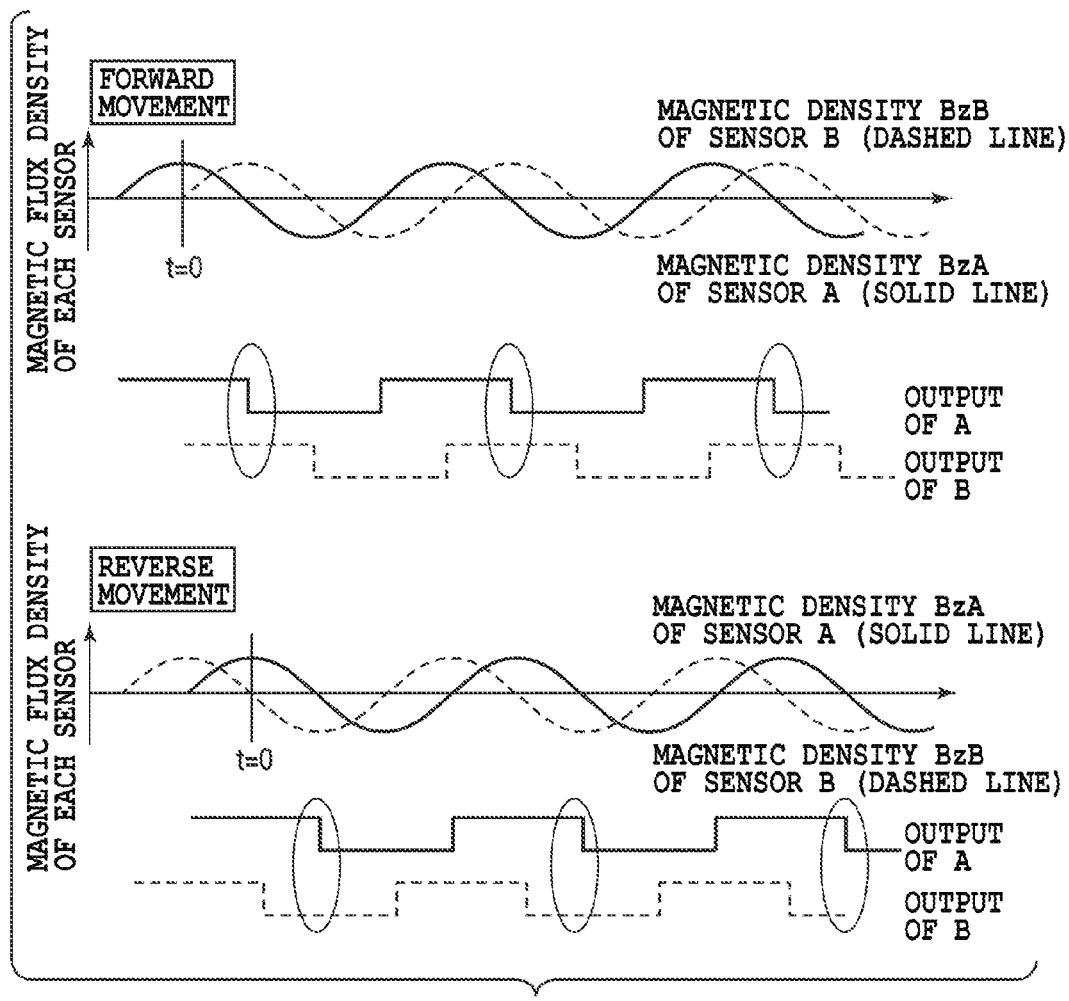
FIG. 7 is an explanatory view illustrating a rotation direction of the magnetized ring and changes of outputs of two Hall ICs in FIG. 6.
Figure 9:
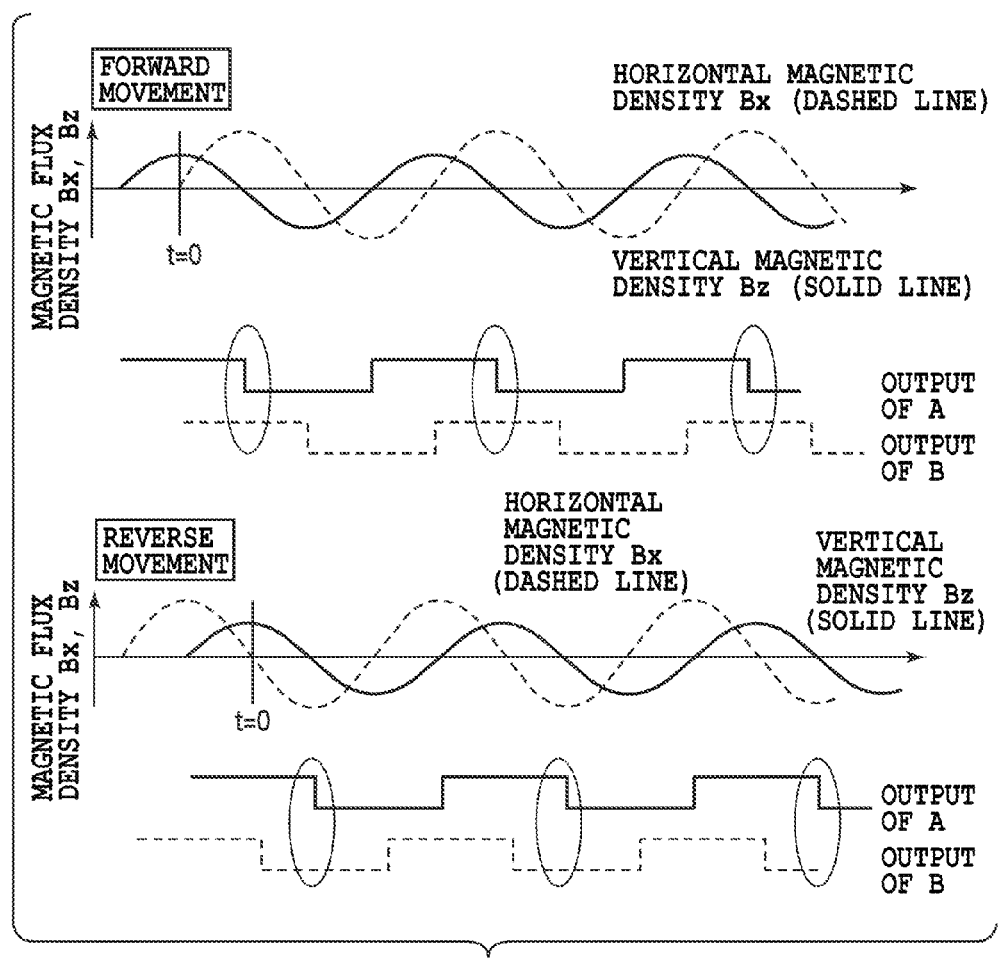
FIG. 9 is an explanatory view illustrating the rotation direction of the magnetized ring and changes in detected Bx and Bz outputs in the present invention.

FIG. 9 is a view showing this relationship, illustrating the case of the same conditions as those of FIG. 7. FIG. 9 shows that basically the same results as those of FIG. 7 can be obtained.

Although it is desirable that the Hall elements and the integrated circuit are formed on a single substrate, it is possible to employ a structure in which a part composed of two Hall elements formed on a compound semiconductor substrate and a magnetic plate formed thereon is electrically connected to an integrated circuit formed on another Si substrate or the like. These can be housed in a single casing.

Second Embodiment

Figure 2:
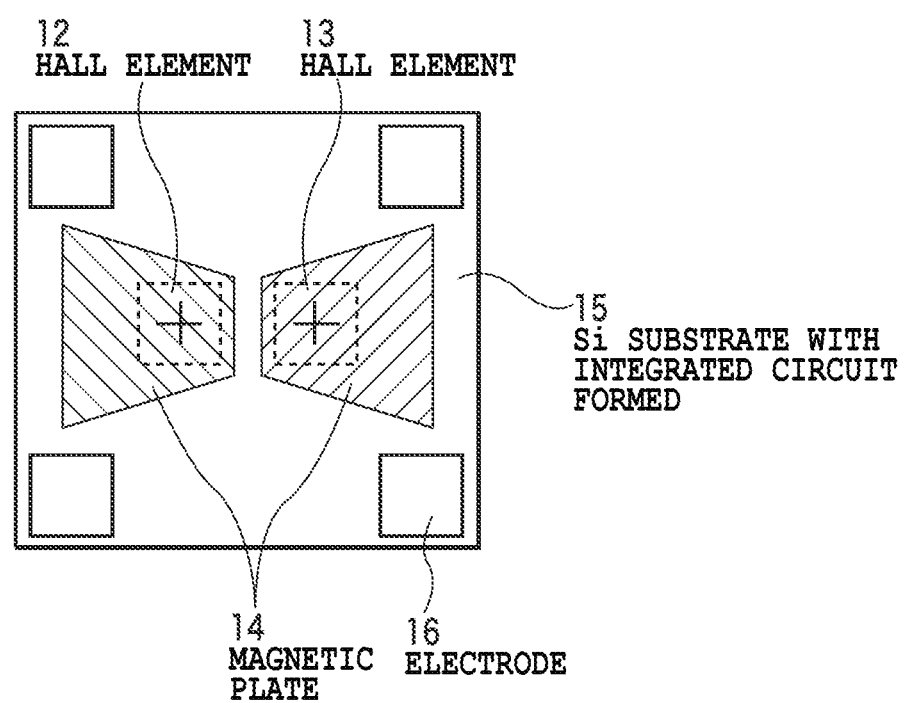
FIG. 2 is a view showing a main portion of a Hall IC according to a second embodiment of the present invention.
Figure 3:
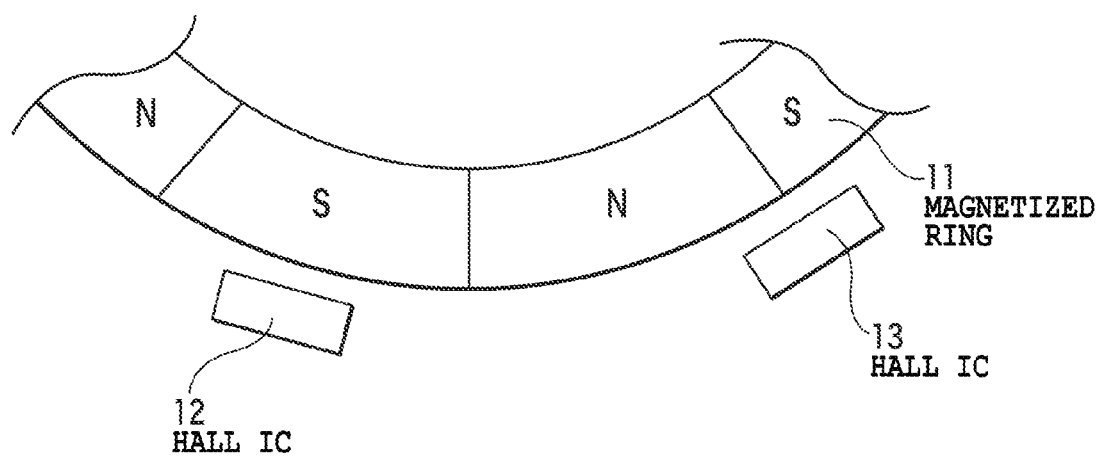
FIG. 3 is an explanatory view showing an example of a conventional art.
Figure 4:
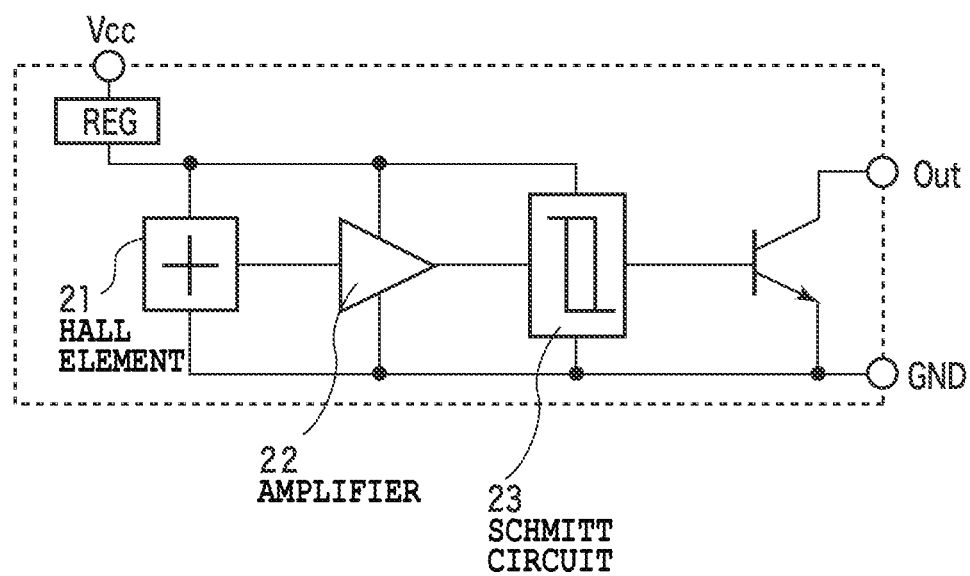
FIG. 4 is an example of a block diagram of the Hall IC used in the example shown in FIG. 2.

FIG. 2 is a view showing a main portion of a Hall IC of a second embodiment of the present invention. This view has a same viewpoint as that of FIG. 1B. In this Hall IC, after two Hall elements are formed close to each other on a Si substrate and a protective film is formed thereon, the substrate is divided into two pieces. The Hall IC includes the two pieces placed with a gap between the Hall elements and thin-film magnetic plates made of Ni—Fe alloy by plating so as to overlap the two pieces. In this drawing, for the purpose of concentrating surrounding magnetic flux onto the Hall elements, each magnetic body 14 has such a planar shape that the width in a direction vertical to a straight line passing through the two Hall elements is large on a side opposite to the Hall elements facing each other and is narrowed near the Hall element. Such a configuration can also provide similar effects to those of FIG. 1B.

in the position detecting apparatus (Hail IC) of the present invention, it can be understood from the aforementioned consideration that distance W between the two Hall elements is smaller than a pole pitch P of the magnetized ring used together. Ideally, it is preferable that W is much smaller than P. The same is true of lengths of the two thin-film magnetic plates in FIG. 2 in a direction of the straight line passing through the two Hall elements. In other words, the distance between the bases of the two thin-film magnetic plates in FIG. 2 is preferably smaller than the pole pitch P of the magnetized ring and more preferably smaller as much as possible.

With the characteristic configuration according to the present invention, the differential signal between the output signals of the two Hall elements can be extracted with high sensitivity even though the distance between the two Hall elements is smaller than the Hall pitch P of the magnetized ring.

The present invention is applicable to a rotational or liner position detecting apparatus such as mechanical products including industrial machines and automobiles and jog dials of hand-held computing devices which need to be reduced in size, thickness, and power consumption.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A position detecting apparatus, comprising:
   a ring-shaped or linear magnetic flux source in which opposite magnetic poles are alternately arranged at an equal pitch;
   a Hall IC used in combination with the magnetic flux source, wherein
   the Hall IC includes:
      two Hall elements placed at a distance from each other;
      a protective film placed on magnetic sensitive portions of the respective two Hall elements and configured to cover the magnetic sensitive portions;
      a thin-film magnetic plate placed on the protective film to cover the magnetic sensitive portions of the two Hall elements;
      a first circuit generating a sum signal of outputs from the two Hall elements; and
      a second circuit generating a differential signal of the outputs from the two Hall elements;
   a first Schmitt circuit comparing an output signal of the first circuit and a Schmitt level to output a comparison result;
   a second Schmitt circuit comparing an output signal of the second circuit and a Schmitt level to output a comparison result; and
   a direction output circuit receiving the comparison results from the first and second Schmitt circuits and generating an output concerning a direction.

2. The position detecting apparatus according to claim 1, further comprising:
   a pulse output circuit receiving the comparison results from the first and second Schmitt circuits and generating an output by XORing the received outputs.

3. The position detecting apparatus according to claim 1, wherein portions of the thin-film magnetic plate covering the magnetic sensitive portions are end portions of the thin-film magnetic plate having a belt shape, the end portions being opposite to each other.

4. The position detecting apparatus according to claim 1, wherein portions of the thin-film magnetic plate covering the magnetic sensitive portions are separated from each other at a midpoint of the two Hall elements in a direction orthogonal to a straight line connecting the two Hall elements.

5. The position detecting apparatus according to claim 2, wherein the two Hall elements, the first and second circuits, the first and second Schmitt circuits, the direction output circuit, and the pulse output circuit are formed on a single substrate.

6. The position detecting apparatus according to claim 2, wherein two Hall elements, the first and second circuits, the first and second Schmitt circuits, the direction output circuit, and the pulse output circuit are accommodated in a case.

* * * * *